United States Patent
Saenger

(10) Patent No.: US 6,767,581 B2
(45) Date of Patent: Jul. 27, 2004

(54) PROCESS FOR THE DEPOSITION OF THIN LAYERS BY CHEMICAL VAPOR DEPOSITION

(75) Inventor: Annette Saenger, Dresden (DE)

(73) Assignee: Infineon Technologies AG, Munich (DE)

( * ) Notice: Subject to any disclaimer, the term of this patent is extended or adjusted under 35 U.S.C. 154(b) by 244 days.

(21) Appl. No.: 10/034,053

(22) Filed: Dec. 20, 2001

(65) Prior Publication Data

US 2002/0127338 A1 Sep. 12, 2002

(30) Foreign Application Priority Data

Dec. 20, 2000 (DE) .......................................... 100 63 717

(51) Int. Cl.$^7$ .............................................. C23C 16/06
(52) U.S. Cl. ................ 427/248.1; 427/250; 427/255.23; 427/255.31; 427/255.34; 427/255.37; 427/255.394
(58) Field of Search ......................... 427/248.1, 255.23, 427/255.31, 255.34, 255.37, 355.394, 250

(56) References Cited

U.S. PATENT DOCUMENTS

| | | | |
|---|---|---|---|
| 3,334,103 A | | 8/1967 | Feldman et al. |
| 5,589,425 A | | 12/1996 | Hoshino et al. |
| 5,637,351 A | * | 6/1997 | O'Neal et al. .......... 427/255.37 |

FOREIGN PATENT DOCUMENTS

EP 1 108 468 A1 6/2001

EP 1 158 070 A1 11/2001

OTHER PUBLICATIONS

J.G. Martin et al.: "Mechanisms of silicone dioxide deposition from the low pressure chemical vapor deposition of diethyisilane/oxygen mixtures", Journal of the Electrochemical Society, vol. 142, Nov. 1995, No. 11, pp. 3873–3880, INSPEC Abstract.

* cited by examiner

Primary Examiner—Timothy Meeks
(74) Attorney, Agent, or Firm—Laurence A. Greenberg; Werner H. Stemer; Gregory L. Mayback

(57) ABSTRACT

A process for the deposition of thin layers by chemical vapor deposition includes adding an effective amount of nitroxyl radicals of the formula

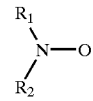

to a gas stream including the materials to be deposited. In this formula, $R_1$ and $R_2$ are identical or different alkyl, alkenyl, alkynyl, acyl, or aryl radicals, with or without heteroatoms. $R_1$ and $R_2$ can also together form a structure $-CR_3R_4-CR_5R_6-CR_7R_8-CR_9R_{10}-CR_{11}R_{12}-$, where $R_3$, $R_4$, $R_5$, $R_6$, $R_7$, $R_8$, $R_9$, $R_{10}$, $R_{11}$, $R_{12}$ are again identical or different alkyl, alkenyl, alkynyl, acyl, or aryl radicals, with or without heteroatoms.

32 Claims, No Drawings

PROCESS FOR THE DEPOSITION OF THIN LAYERS BY CHEMICAL VAPOR DEPOSITION

BACKGROUND OF THE INVENTION

FIELD OF THE INVENTION

The invention relates to a process for the deposition of thin layers by chemical vapor deposition.

In the semiconductor industry, both physical vapor deposition (PVD) and chemical vapor deposition (CVD) processes are used for the deposition of thin layers. Compared to PVD processes, the CVD processes give better edge coverage and greater conformity throughout the coating. CVD processes are therefore used in particular for filling deep trench capacitors or contact holes. The films produced in this way can be either dielectrics (e.g. silicon dioxide, silicon nitride, aluminum oxide, tantalum oxide, etc.) or metals and metal-containing compounds. In particular, layers of transition metals, e.g. tungsten, and of transition metal silicides and nitrides, e.g. WN, WSix, CoSi, TaSi, etc., are deposited.

In CVD processes, the starting materials are introduced into the reactor chamber as gaseous compounds and react on the substrate surface to give the desired end product. The energy necessary for the reaction is introduced in the form of heat by heating the walls, radiation, or susceptor/wafer heating. The typical temperature range for the deposition is from 400° C. to 900° C.

However, there are applications, e.g. filling of structures having extreme aspect ratios or deposition on heat-sensitive layers such as aluminum metalization or organic dielectrics, in which significantly lower temperatures, which are more than 100° C. below the abovementioned customary temperatures, are desirable. Lower temperatures increase edge coverage and conformity and, secondly, the deposition of certain layers without damage to the underlying substrate is made possible for the first time.

Various disadvantages stand in the way of carrying out CVD processes at lower temperatures. Thus, for example, the deposition of certain layers can only be completed above a particular temperature, so that reducing the temperature is not possible at all. In the case of depositions that can be completed in principle, the deposition rate is sometimes reduced so much that the process cannot be completed economically. In other deposition reactions, only the nucleation step (i.e. the covering of the substrate surface with a first layer of the substance to be deposited) is problematical; further deposition can occur at the reduced temperature.

For the reasons mentioned, attempts have been made to develop methods that enable CVD processes to be completed at relatively low temperatures. Such a method of reducing the temperature is the generation of plasma. The ions, free radicals, and excited molecules formed in this way are more reactive than the starting molecules, so that the deposition reactions can occur at lower temperature. However, these plasma enhanced chemical vapor deposition (PECVD) processes frequently result, due to the reactivity and variety of substances formed, in undesirable gas-phase reactions or undesirable secondary reactions which then lead to increased contamination of the layers with extraneous substances.

U.S. Pat. No. 5,637,351 describes a method of increasing the deposition rate in CVD processes. The method adds free-radical formers to the CVD reactor. The patent discloses using organic free-radical formers in the deposition of $SiO_2$ from a diethylenesilane/oxygen mixture.

There nevertheless continues to be a need for processes that enable the temperature in CVD processes to be decreased while maintaining economically justifiable deposition rates.

SUMMARY OF THE INVENTION

It is accordingly an object of the invention to provide a process for the deposition of thin layers by chemical vapor deposition that overcomes the hereinafore-mentioned disadvantages of the heretofore-known devices of this general type and that provides a process for the deposition of thin layers by chemical vapor deposition, which can be carried out at temperatures lower than those known from the prior art.

With the foregoing and other objects in view, there is provided, in accordance with the invention, a process for depositing thin layers by chemical vapor deposition. The first step is adding to a gas stream including materials to be deposited an effective amount of nitroxyl radicals of the formula:

$R_1$ and $R_2$ are selected from the group including of alkyl, alkenyl, alkynyl, acyl, and aryl radicals. $R_1$ and $R_2$ can be identical or different. The alkyl, alkenyl, alkynyl, acyl, and aryl radicals can include heteroatoms.

In accordance with a further object of the invention, the next step is forming from $R_1$ and $R_2$ a structure —$CR_3R_4$—$CR_5R_6$—$CR_7R_8$—$CR_9R_{10}$—$CR_{11}R_{12}$—, wherein $R_3$, $R_4$, $R_5$, $R_6$, $R_7$, $R_8$, $R_9$, $R_{10}$, $R_{11}$, $R_{12}$ can be identical or different and are selected from the group including alkyl, alkenyl, alkynyl, acyl, and aryl radicals with or without heteroatoms.

As stated, in the process of the invention for the deposition of thin layers by chemical vapor deposition, an effective amount of nitroxyl radicals of the formula

is added to the gas stream comprising the materials to be deposited. In this formula, $R_1$ and $R_2$ are identical or different alkyl, alkenyl, alkynyl, acyl, or aryl radicals with or without heteroatoms. $R_1$ and $R_2$ can also together form a structure —$CR_3R_4$—$CR_5R_6$—$CR_7R_8$—$CR_9R_{10}$—$CR_{11}R_{12}$—, where $R_3$, $R_4$, $R_5$, $R_6$, $R_7$, $R_8$, $R_9$, $R_{10}$, $R_{11}$, $R_{12}$ are again identical or different alkyl, alkenyl, alkynyl, acyl, or aryl radicals with or without heteroatoms.

In the process of the invention, nitroxyl radicals are added to the gas mixture that is introduced into the reactor chamber. This significantly reduces the deposition temperature compared to conventional CVD processes and the substrate is subjected to considerably less thermal stress. This is particularly advantageous when heat-sensitive layers are already present, e.g. low-k dielectrics based on organic compounds. In addition, a more conformal deposit is achieved. At a given reaction temperature, the addition of the nitroxyl radicals significantly increases the deposition rate or makes the reaction possible for the first time. The nitroxyl radicals differ in their reactivity, so that the deposition reaction can be controlled by appropriate selection of the substances. In addition, attachment of the radicals to the surface can increase the reactivity of the surface, thus allowing deposition on inert or passivated substrates.

Preference is given to embodiments in which $R_1$ and $R_2$ form a structure $—CR_3R_4—CR_5R_6—CR_7R_8—CR_9R_{10}—CR_{11}R_{12}—$, in which $R_3, R_4, R_5, R_6, R_7, R_8, R_9, R_{10}, R_{11}, R_{12}$ are identical or different and are each hydrogen, methyl or ethyl. Particular preference is given to $R_1$ and $R_2$ forming a structure $—CR_3R_4—CR_5R_6—CR_7R_8—CR_9R_{10}—CR_{11}R_{12}—$ in which $R_3$, $R_4$, $R_{11}$, $R_{12}$ are each methyl and $R_5$, $R_6$, $R_7$, $R_8$, $R_9$, $R_{10}$ are each hydrogen. The compound defined in this way, viz. 2,2,6,6-tetramethyl-1-piperinyloxy, sublimes without decomposition under reduced pressure and is therefore very well suited to CVD applications.

The process of the invention is preferably employed for the deposition of a dielectric material, in particular for the deposition of silicon dioxide, silicon nitride, aluminum oxide, tantalum oxide, or a mixture thereof.

The process of the invention is also very well suited to the deposition of a metal or a metal alloy, in particular for the deposition of tungsten, cobalt, tantalum, or a mixture thereof.

Good results are likewise obtained in the deposition of metal-containing compounds, in particular the deposition of a metal nitride or a metal silicide, with the deposition of WN, $WSi_x$, CoSi, TaSi, or a mixture thereof being found to be very particularly advantageous.

The addition of free nitroxyl radicals is particularly useful when only one precursor gas is utilized, i.e. when only one chemical compound apart from the added nitroxyl radicals is present in the gas stream including the materials to be deposited. The addition of nitroxyl radicals greatly restricts undesirable secondary reactions or premature gas-phase reactions.

As already explained, the addition of free nitroxyl radicals serves to allow the CVD process to proceed at temperatures lower than those customarily employed. Preference is therefore given to carrying out the deposition at a temperature in the range from 100° C. to 500° C. The deposition is particularly preferably carried out at a temperature in the range from 150° C. to 250° C.

In the process of the invention, preference is given to adding only very small amounts of nitroxyl radicals to the gas mixture. If the process conditions or reaction mechanism are appropriate, very small amounts of nitroxyl radicals can suffice. The nitroxyl radicals are preferably added in a concentration of less than five percent (<5%), particularly preferably a concentration of less than one percent (<1%), to the gases required for the deposition.

Other features which are considered as characteristic for the invention are set forth in the appended claims.

Although the invention is illustrated and described herein as embodied in a process for the deposition of thin layers by chemical vapor deposition, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In a preferred embodiment of the present invention, the nitroxyl radicals are added to the gas mixture only at the beginning of the deposition process. This procedure is particularly advantageous in CVD processes in which a nucleation step occurs first. In this case, it is sufficient to add the radicals only during the initial period of time in order to initiate the reaction. The actual deposition then continues as a free-radical chain reaction. An example of this embodiment of the present invention is the deposition of tungsten silicide. Nitroxyl radicals are added during the nucleation step of the tungsten silicide CVD using a mixture of dichlorosilane and tungsten hexafluoride. The dichlorosilane reaction proceeds via free radicals as intermediates, and the nucleation step is temperature-critical. Once the nucleation layer has been formed, the deposition continues without further addition of nitroxyl radicals.

Particular preference is given to adding the nitroxyl radicals for a period of from 5 to 20 seconds at the beginning of the deposition process.

Preference is likewise given to an embodiment in which the nitroxyl radicals are alternately added to the gas mixture for a particular time and then not added for a particular time during the deposition process. This embodiment enables, for example, double or multiple layers of different substances to be deposited. An example of this embodiment of the present invention is the deposition of a tungsten layer or a $WSi_x$ layer without addition of radicals, subsequent addition of radicals and dichlorosilane to deposit silicon, and subsequently renewed deposition of tungsten or tungsten silicide without addition of radicals. This method achieves compound compositions/stoichiometries that are not possible by simultaneous deposition. The length of the periods of time during which nitroxyl radicals are added and not added depends on the thickness of the layer that is to be deposited in each case.

Particular preference is given to continuous addition of the nitroxyl radicals to the gas mixture during the entire deposition process. In this way, a reduction in the temperature and/or acceleration of the deposition can be achieved. Examples of this embodiment of the present invention are the deposition of $SiO_2$ using $SiH_4/O_3$ or $TEOS/O_2$ mixtures, the deposition of $Si_3N_4$ using $NH_3/SiH_4$ mixtures, the deposition of metal silicides using dichlorosilane or silane and the deposition of silicon using silane, disilane, and dichlorosilane.

The process of the invention can be employed particularly advantageously for the deposition of thin layers on semiconductor materials, for filling deep trench capacitors and for filling contact holes.

EXAMPLES

The ranges given in brackets for pressure, temperature and gas flows in the examples below indicate the possible process window. The individual values can be varied within these ranges, and the layers deposited then differ in terms of their composition (e.g. the tungsten silicide can be enriched with W or Si) and/or deposition rates. The deposition can thus be matched to the particular requirements.

Example 1

A batch process, i.e. one in which a plurality of wafers can be coated simultaneously, is conducted in a vertical furnace (for example, from SVG, model AVP 8000) having a capacity of up to 150 wafers.

A silicon nitride layer is deposited according to a CVD process. Ammonia ($NH_3$) and dichlorosilane ($SiCl_2H_2$) were used as precursor gases in the presence of the radical 2,2,6,6-tetramethyl-1-piperidinyloxy.

The deposition is conducted in a temperature range from 400 to 500° C. This range contrasts standard temperatures for the deposition of silicon nitride, which are from 650 to 800° C.

| | Flow rates: | |
|---|---|---|
| ammonia | 280 sccm | (230–400 sccm) |
| dichlorosilane | 70 sccm | (40–150 sccm) |
| 2,2,6,6-tetramethyl-1-piperidinyloxy | 3 sccm | (2.5–4 sccm) |
| total pressure | 150 torr | (100–250 torr) |

Example 2

The deposition is conducted in a single wafer unit (model "Centura" from Applied Materials). The wafer is heated from below via the support, and the gases are introduced above the wafer.

A tungsten silicide layer is deposited on a substrate in a CVD process. Precursor gases used are tungsten hexafluoride (WF$_6$) and dichlorosilane (SiCl$_2$H$_2$). The radical 2,2,6,6-tetramethyl-1-piperidinyloxy is added during a nucleation step that precedes the actual deposition. The radical is added for a period of 15 sec (from 7 to 25 sec).

The deposition is conducted in a temperature range from 300 to 400° C. This range contrasts standard temperatures for the deposition of tungsten silicide, which are from 500 to 600° C.

| | Flow rates: | |
|---|---|---|
| tungsten hexafluoride | 3 sccm | (1–5 sccm) |
| dichlorosilane | 300 sccm | (100–300 sccm) |
| 2,2,6,6-tetramethyl-1-piperidinyloxy | 2.5 sccm | (1.5–3.5 sccm) |
| total pressure | 1.0 torr | (0.7–5 torr) |

Example 3

The deposition is conducted in a single wafer unit (model "Centura" from Applied Materials). The wafer is heated from below via the support, and the gases are introduced above the wafer.

The layer sequence polysilicon/tungsten silicide/polysilicon is deposited on a substrate according to a CVD process. Precursor gases used are tungsten hexafluoride (WF$_6$) and dichlorosilane (SiCl$_2$H$_2$). 2,2,6,6-tetramethyl-1-piperidinyloxy is used as radical.

The deposition is conducted in a temperature range from 300 to 400° C. This range contrasts standard temperatures for the deposition of tungsten silicide, which are from 500 to 600° C., and for polysilicon, which is normally deposited at temperatures above 600° C.

The specific parameters for the deposition of the various layers are as follows:

a) Silicon Layer

| | Flow rates: | |
|---|---|---|
| tungsten hexafluoride | 0 | |
| dichlorosilane | 300 sccm | (100–300 sccm) |
| 2,2,6,6-tetramethyl-1-piperidinyloxy | 2.0 sccm | (1–4 sccm) |
| total pressure | 3.0 torr | (0.7–5 torr) | b) Tungsten Silicide Layer

| | Flow rates: | |
|---|---|---|
| tungsten hexafluoride | 3 sccm | (1–5 sccm) |
| dichlorosilane | 300 sccm | (100–300 sccm) |
| 2,2,6,6-tetramethyl-1-piperidinyloxy | 0 | |
| total pressure | 1.0 torr | (0.7–5 torr) |

A tungsten-rich silicide WSi is deposited.

c) Silicon Layer

| | Flow rates: | |
|---|---|---|
| tungsten hexafluoride | 0 | |
| dichlorosilane | 300 sccm | (100–300 sccm) |
| 2,2,6,6-tetramethyl-1-piperidinyloxy | 2.0 sccm | (1–4 sccm) |
| total pressure | 3.0 torr | (0.7–5 torr) |

I claim:

1. A process for depositing thin layers by chemical vapor deposition, which comprises:
    adding to a gas stream including materials to be deposited an amount of nitroxyl radicals of the formula

the R$_1$ and R$_2$ being selected from the group consisting of alkyl, alkenyl, alkynyl, acyl, and aryl radicals.

2. The process according to claim 1, wherein R$_1$ and R$_2$ are identical.

3. The process according to claim 1, wherein R$_1$ and R$_2$ are different.

4. The process according to claim 1, which further comprises including heteroatoms in the group consisting of alkyl, alkenyl, alkynyl, acyl, and aryl radicals.

5. The process according to claim 1, which further comprises not including heteroatoms in the group consisting of alkyl, alkenyl, alkynyl, acyl, and aryl radicals.

6. The process according to claim 1, which further comprises:
    forming from R$_1$ and R$_2$ a structure —CR$_3$R$_4$—CR$_5$R$_6$—CR$_7$R$_8$—CR$_9$R$_{10}$—CR$_{11}$R$_{12}$—;
    wherein R$_3$, R$_4$, R$_5$, R$_6$, R$_7$, R$_8$, R$_9$, R$_{10}$, R$_{11}$, R$_{12}$ are selected from the group consisting of alkyl, alkenyl, alkynyl, acyl, and aryl radicals.

7. The process according to claim 6, wherein R$_3$, R$_4$, R$_5$, R$_6$, R$_7$, R$_8$, R$_9$, R$_{10}$, R$_{11}$, R$_{12}$ are identical.

8. The process according to claim 6, wherein R$_3$, R$_4$, R$_5$, R$_6$, R$_7$, R$_8$, R$_9$, R$_{10}$, R$_{11}$, R$_{12}$ are different.

9. The process according to claim 6, which further comprises including heteroatoms in the group consisting of alkyl, alkenyl, alkynyl, acyl, and aryl radicals.

10. The process according to claim 6, which further comprises not including heteroatoms in the group consisting of alkyl, alkenyl, alkynyl, acyl, and aryl radicals.

11. The process according to claim 1, which further comprises forming from $R_1$ and $R_3$ a structure —$CR_3R_4$—$CR_5R_6$—$CR_7R_8$—$CR_9R_{10}$—$CR_{11}R_{12}$—; wherein $R_3$, $R_4$, $R_5$, $R_6$, $R_7$, $R_8$, $R_9$, $R_{10}$, $R_{11}$, $R_{12}$ are selected from the group consisting of hydrogen, methyl, and ethyl.

12. The process according to claim 11, wherein $R_3$, $R_4$, $R_5$, $R_6$, $R_7$, $R_8$, $R_9$, $R_{10}$, $R_{11}$, $R_{12}$ are identical.

13. The process according to claim 11, wherein $R_3$, $R_4$, $R_5$, $R_6$, $R_7$, $R_8$, $R_9$, $R_{10}$, $R_{11}$, $R_{12}$ are different.

14. The process according to claim 1, which further comprises forming from $R_1$ and $R_2$ a structure —$CR_3R_4$—$CR_5R_6$—$CR_7R_8$—$CR_9R_{10}$—$CR_{11}R_{12}$—; wherein $R_3$, $R_4$, $R_{11}$, $R_{12}$ are each methyl, and $R_5$, $R_6$, $R_7$, $R_8$, $R_9$, and $R_{10}$ are each hydrogen.

15. The process according to claim 1, wherein at least one of the materials to be deposited is a dielectric.

16. The process according to claim 15, wherein the dielectric to be deposited is selected from the group consisting of silicon dioxide, silicon nitride, aluminum oxide, tantalum oxide, and a mixture thereof.

17. The process according to claim 1, wherein at least one of the materials to be deposited is a metal alloy.

18. The process according to claim 17, wherein the metal alloy is a mixture of metals selected from the group consisting of tungsten, cobalt, and tantalum.

19. The process according to claim 1, wherein at least one of the materials to be deposited is a metal.

20. The process according to claim 19, wherein the metal is selected from the group consisting of tungsten, cobalt, and tantalum.

21. The process according to claim 1, wherein at least one of the materials to be deposited is a metal-containing compound.

22. The process according to claim 21, wherein said metal-containing compound is selected from the group consisting of a metal nitride and a metal silicide.

23. The process according to claim 21, wherein said metal containing compound is selected from the group consisting of WN, $WSi_x$, CoSi, TaSi, and a mixture thereof.

24. The process according to claim 1, wherein only one chemical compound apart from the added nitroxyl radicals is present in the gas stream including the materials to be deposited.

25. The process according to claim 1, which further comprises heating to a temperature between 100° C. and 500° C.

26. The process as claimed in claim 1, which further comprises heating to a temperature between 150° C. and 250° C.

27. The process according to claim 1, which further comprises adding the nitroxyl radicals to the gas mixture in a concentration of less than five percent (<5%).

28. The process according to claim 27, which further comprises adding the nitroxyl radicals to the gas mixture in a concentration of less than one percent (<1%).

29. The process according to claim 1, which further comprises adding the nitroxyl radicals the gas mixture only at the beginning of the deposition process.

30. The process according to claim 29, which further comprises adding the nitroxyl. radicals to the gas mixture only for a period from five to twenty seconds (5–20 sec.) at the beginning of the deposition process.

31. The process according to claim 1, which further comprises alternatively adding the nitroxyl radicals to the gas mixture for a particular time and then not adding the nitroxyl radicals for a particular time during the deposition process.

32. The process according to claim 1, which further comprises continuously adding the nitroxyl radicals to the gas mixture during the entire deposition process.

* * * * *